(12) United States Patent
Suga

(10) Patent No.: US 6,292,005 B1
(45) Date of Patent: Sep. 18, 2001

(54) PROBE CARD FOR IC TESTING APPARATUS

(75) Inventor: Kazunari Suga, Tokyo (JP)

(73) Assignee: Advantest Corporatin, Tokyo (JP)

( * ) Notice: Subject to any disclaimer, the term of this patent is extended or adjusted under 35 U.S.C. 154(b) by 0 days.

(21) Appl. No.: 09/346,045

(22) Filed: Jul. 7, 1999

(30) Foreign Application Priority Data

Jul. 7, 1998 (JP) .................................................. 10-191310

(51) Int. Cl.$^7$ ............................ G01R 1/073; G01R 31/28
(52) U.S. Cl. ........................ 324/754; 324/757; 324/158.1
(58) Field of Search .................................. 324/754, 757, 324/762, 72.5, 765, 158.1

(56) References Cited

U.S. PATENT DOCUMENTS

| | | | |
|---|---|---|---|
| 4,382,228 | * 5/1983 | Evans | 324/762 |
| 4,563,640 | * 1/1986 | Hasegawa | 324/754 |
| 5,691,651 | * 11/1997 | Ehlermann | 324/762 |
| 5,729,150 | * 3/1998 | Schwindt | 324/754 |

* cited by examiner

*Primary Examiner*—Ernest Karlsen
(74) *Attorney, Agent, or Firm*—Birch, Stewart, Kolasch & Birch, LLP

(57) ABSTRACT

A probe card 2 for an IC testing apparatus electrically connected to a test head board 11 of the IC testing apparatus and having a plurality of needle contacts 211 provided on a main surface for electrical contact with a device under test, wherein a plurality of zero insertion force connectors electrically connected to the needle contacts are provided at substantially radial positions from the position where the needle contacts are provided.

4 Claims, 3 Drawing Sheets

PROBE CARD FOR IC TESTING APPARATUS

BACKGROUND OF THE INVENTION

1. Field of the Invention

The present invention relates to an IC testing apparatus for testing a semiconductor integrated circuit device or other various types of electronic devices (hereinafter referred to as an "IC" as a representative example), more particularly relates to a probe card used for connecting a test head and a device under test.

2. Description of the Related Art

A large number of semiconductor integrated circuit devices are formed on a silicon wafer etc., then go through various processes such as dicing, wire bonding, and packaging to complete electronic devices. Such ICs are tested operationally before shipment. These tests of the ICs are conducted in either the state of the completed products or the wafer state.

As an IC testing apparatus for testing ICS in the wafer state, there is known the one disclosed in Japanese Utility Model Publication (Kokai) No. 5-15431, for example. In this IC testing apparatus, zero insertion force connectors are attached to reduce the force for pressing a probe card provided with needles (pin contacts) from the test head and thereby poor contact due to deformation of the probe card is prevented.

In the conventional probe card, however, since the distance from the needles to the contacts of the zero insertion force connectors connected to the same was uneven, there was the problem that the impedances of the wiring patterns differed and the electrical characteristics fluctuated.

SUMMARY OF THE INVENTION

It is an object of the present invention to provide a probe card for an IC testing apparatus superior in electrical characteristics.

(1) According to the present invention, there is provided a probe card for an IC testing apparatus to be electrically connected to a test head board of the IC testing apparatus and having a plurality of needle contacts for electrical contact with a device under test provided on its main surface, wherein a plurality of connectors electrically connected to said needle contacts are provided at substantially radial positions from the position where said needle contacts are provided.

In this invention, the connector is not particularly limited, but preferably the connector is zero insertion force connector.

In the probe card for an IC testing apparatus of the present invention, since the connectors are provided at substantially radial positions from the position where the needle contacts are provided, the distance between the needle contacts and the contacts of the connectors connected to them can be set uniformly. Therefore, it is possible to make the impedances of the wirings from the needle contacts to the connectors uniform and thereby possible to suppress fluctuations in the electrical characteristics.

The "substantially radial positions" of the present invention mean positions or areas of substantially equal distances (distances from center point) fanning out radially from the position or area where the needle contacts are provided and do not mean strict radial shapes geometrically. The point is that the all positions are included where the impedances of the wiring connecting the needle contacts and contacts of the connectors become uniform enough not to have an effect on the electrical characteristics of the probe card. (2) In the above invention, the specific means for arranging the zero force connectors substantially radially from the position where the needle contacts are provided is not particularly limited, but as one embodiment, it is possible to mention a probe card for an IC testing apparatus wherein a board is formed in a circular shape, said needle contacts are provided at the substantial center of the board, and said parts of the zero insertion force connectors are provided at outer circumferential edges of the board.

When the device under test is a logic type IC etc., a small number of one or two devices under test are often simultaneously measured, but in this case the main surface of the board can be used efficiently and the distance between the needle contacts and zero insertion force connectors can be easily laid out uniformly by providing the needle contacts at the substantial center of the board and providing the zero insertion force connectors at the outer circumferential edges of the board.

The "zero insertion force connectors" referred to in the present invention mean connectors of a type not requiring application of force in the direction or insertion or withdrawal when inserting together or pulling apart parts of the zero insertion force connectors. The specific structure is not particularly limited.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects and features of the present invention will be explained in more detail below with reference to the attached drawings which are given by way of illustration only, and thus are not limitative of the present invention, and wherein.

DESCRIPTION OF THE PREFERRED EMBODIMENTS

Embodiments of the present invention will be explained below based on the drawings.

Figure 1:
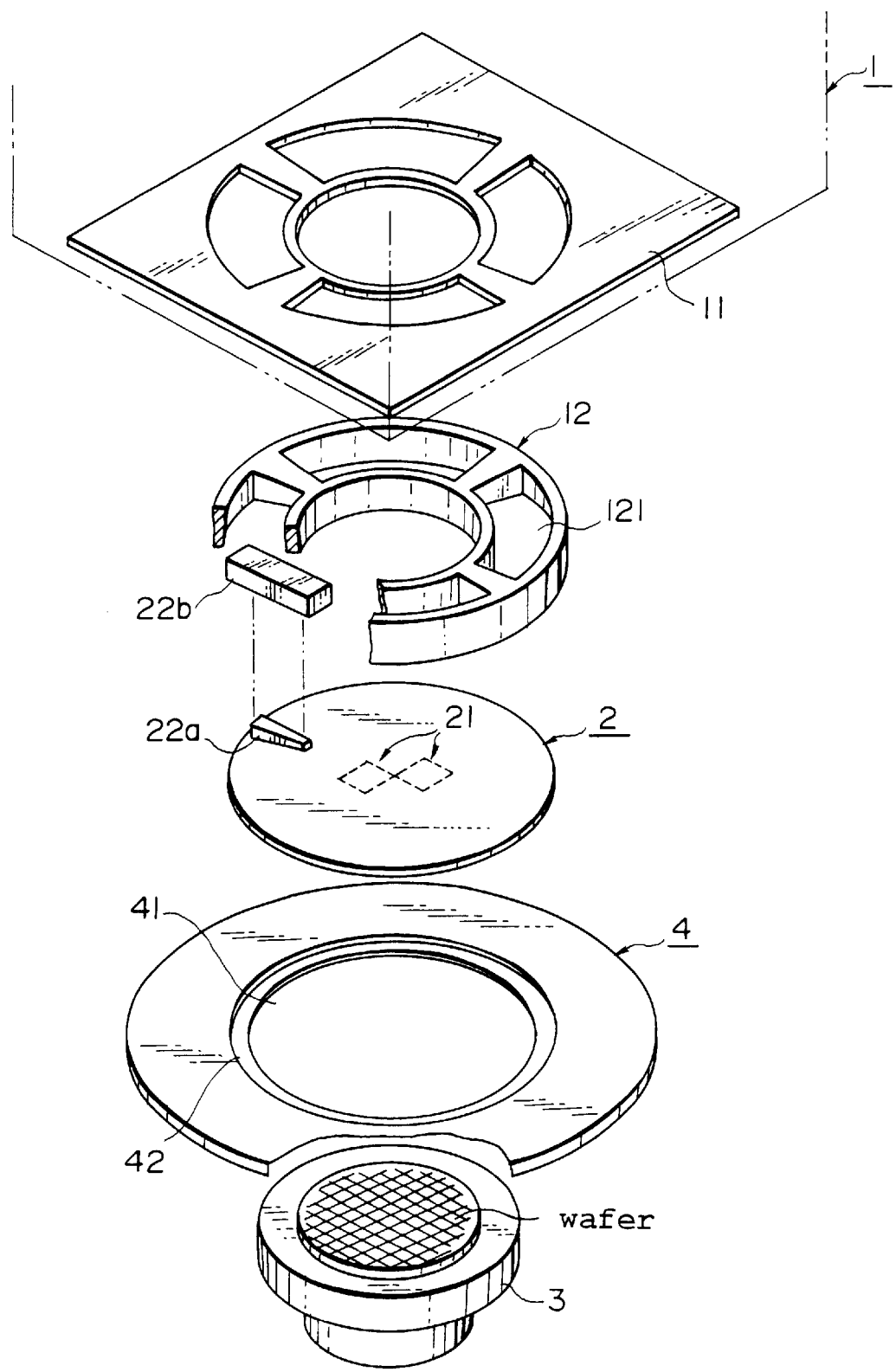
FIG. 1 is an exploded perspective view of key parts showing a test head of an IC testing apparatus to which the probe card of the present invention is applied.

As shown in FIG. 1, the devices under test, that is, wafer ICs, are a large number of semiconductor circuits formed integrated on a single wafer. When testing them, the wafer is held by vacuum by a wafer chuck 3 and held in a state positioned with a high accuracy.

Figure 2:
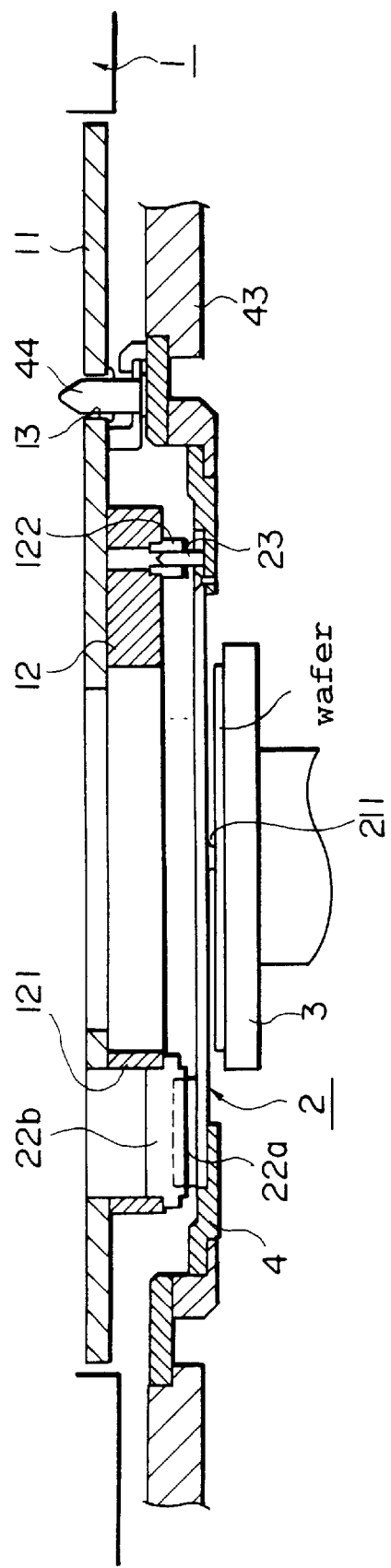
FIG. 2 is a sectional view of the state of a probe card of FIG. 1 attached to the test head.

A card holder 4 positioned above the wafer chuck 3 is formed with a circular through hole 41 at its center. Around the circumferential edge of the through hole 41 is formed a step 42 for holding the probe card 2. This card holder 4 is affixed to a ring carrier 43 as shown in FIG. 2. It is positioned with respect to the later mentioned top plate 11 by insertion of guide pins 44 provided at the ring carrier 43 side into guide bushes 13 provided at a top plate 11 side.

Figure 3:
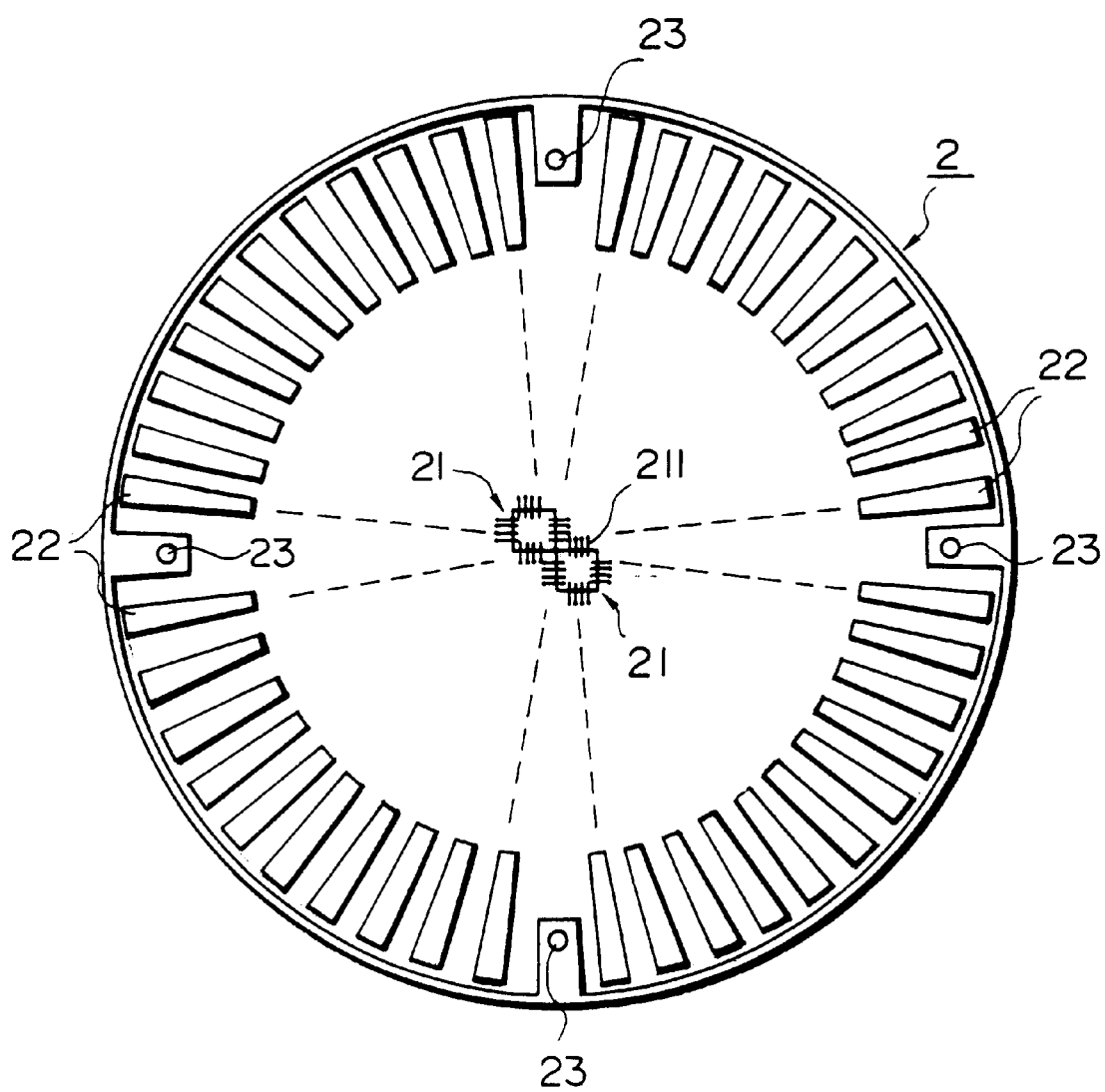
FIG. 3 is a plan view of the probe card of FIG. 1.

The probe card 2 of this embodiment has a circularly formed board and is provided at the substantial center of its main surface (bottom surface in FIG. 1 and FIG. 2) with two needle groups 21 (corresponding to pin contacts of the present invention) so as to enable simultaneous measurement of two ICs. These two needle groups 21 are shaped corresponding to the shapes of the ICs formed on the wafer (square shapes in the example illustrated) arranged in two diagonally from each other (offset from each other) as shown in FIG. 3.

One of the needle groups 21 among these is provided with exactly the number of needles 211 for contact with the terminals of one IC formed on the wafer (contacts in state before wire bonding). As shown in FIG. 2, the front ends of the needles 211 face the wafer IC side, while the other ends are affixed to the board of the probe card 2.

Note that the two needle groups 21 are arranged diagonally from each other as illustrated to avoid the needles 211 from interfering with each other. Further, in this embodiment, the example of measurement of two ICs simultaneously was mentioned, but the probe card 2 of the present invention is not limited in any way as to the number of ICs simultaneously measured. It may also be a type measuring one IC or simultaneously measuring three or more ICs.

In the probe card 2 of the present embodiment, parts 22a of zero insertion force connectors are attached at substantially equal intervals at the outer circumferential edges of the main surface (top surface in FIG. 1 and FIG. 2) of the opposite side of the board.

The "zero insertion force connectors" mean connectors of a type not requiring application of force in the direction of insertion or withdrawal (vertical direction in this example) when inserting or pulling parts into or out of other zero insertion force connector parts 22b provided at the later explained contact ring. It is possible to use ones of a type where a slider is used to move a rail built in the connector in the longitudinal direction back and forth to move a cam engaged with the rail up and down and use that vertical movement of the cam to reduce or increase the distance between socket contacts gripping the pin contacts or ones of another type.

Note that the needles 211 and contacts of the zero insertion force connectors 22a are electrically connected by wiring patterns or through holes (both not shown in the figures) formed on or in the board of the probe card 2.

On the other hand, the test head 1 of the IC testing apparatus is positioned above the wafer chuck 3. While not illustrated, various boards are provided here, such as the performance board. At the bottommost surface of the test head 1 is affixed a top panel 11 as shown in FIG. 1 and FIG. 2. Further, a contact ring 12 is affixed to the bottom surface of the top panel 11.

The contact ring 12 of the present embodiment is formed in a ring shape as shown in FIG. 1. The other parts 22b of the zero insertion force connectors explained above are affixed at the partially sectoral shaped through holes 121 formed at its outer circumference. The sectional view of FIG. 2 shows the state of attachment of the zero insertion force connectors 22b.

Further, the probe card 2 and the contact ring 12 are positioned with respect to each other by making guide pins 23 provided at the probe card 2 side engage with guide bushes 122 provided at the contact ring 12 side.

Note that while not illustrated, the zero insertion force connector parts 22b attached to the contact ring 12 side and the performance board in the test head 1 are electrically connected by a large number of wires or daughter boards.

Next, the operation will be explained.

When testing wafer ICs, first the wafer held by suction by the wafer chuck 3 while positioning it. In that state, the wafer chuck 3 is positioned in the X-Y plane so that the needles 211 of the probe card 2 will contact the contacts of two target ICs and made to rise. Due to this, the first two ICs are tested. When the test is completed, the wafer chuck 3 is made to descend slightly, then the wafer chuck 3 is positioned in the X-Y plane so that the needles 211 of the probe card 2 will contact the contacts of the next two ICs and again made to rise. This operation is repeated to test the wafer ICs in all of the regions.

In particular, since the probe card 2 of the present embodiment is provided with two needle groups 21, 21 arranged at the center of the circular board and is provided with parts 22a of the zero insertion force connectors arranged at the outer circumferential edges of the circular board, the distances of the wiring patterns to electrically connect with the same become substantially equal at all needles 211. Therefore, the impedances of the wiring patterns reaching from the needles 211 to the contacts of the zero insertion force connectors 22a become uniform and therefore the fluctuation in electrical characteristics becomes remarkably smaller.

Note that the embodiment explained above was described to facilitate understanding of the present invention and was not described to limit the present invention. Therefore, elements disclosed in the above embodiment include all design modifications and equivalents belonging to the technical field of the present invention.

What is claimed is:

1. A probe card for an IC testing apparatus comprising:
   a board having a main surface;
   a plurality of needle contacts for electrical contact with a device under test, the needle contacts being provided on the main surface of said board; and
   a plurality of pairs of zero insertion force connectors provided on the main surface of said board at substantially radial positions thereof from the position where said needle contacts are provided, one of said connectors being electrically connected to said needle contacts, another of said connectors being electrically connected to a test head board of the IC testing apparatus.

2. The probe card for an IC testing apparatus as set forth in claim 1, wherein said board is in a circular shape, said needle contacts are provided at a substantial center of the board, and said zero insertion force connectors are provided at outer circumferential edges of the board.

3. An IC testing apparatus comprising:
   a chuck for holding a semiconductor device to be tested;
   a test head for at least one of outputting a test signal to the semiconductor device and inputting a test signal from the semiconductor device; and
   a probe card comprising:
      a board having a main surface;
      a plurality of needle contacts for electrical contact with the semi-conductor device under test, the needle contacts being provided on the main surface of said board; and a plurality of pairs of zero insertion force connectors provided on the main surface of said board at substantially radial positions thereof from the position where said needle contacts are provided, one of said connectors being electrically connected to said needle contacts, another of said connectors being electrically connected to a test head board of the IC testing apparatus.

4. The IC testing apparatus as set forth in claim 3, wherein said board is in a circular shape, said needle contacts are provided at a substantial center of the board, and said connectors are provided at outer circumferential edges of the board.

* * * * *